(12) United States Patent
Sato et al.

(10) Patent No.: US 10,006,546 B2
(45) Date of Patent: Jun. 26, 2018

(54) PISTON RING

(71) Applicant: KABUSHIKI KAISHA RIKEN, Tokyo (JP)

(72) Inventors: Masayuki Sato, Kashiwazaki (JP); Yuuichi Murayama, Kashiwazaki (JP); Youhei Iwamoto, Kashiwazaki (JP); Takuma Sekiya, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 93 days.

(21) Appl. No.: 15/025,732

(22) PCT Filed: Sep. 26, 2014

(86) PCT No.: PCT/JP2014/075630
§ 371 (c)(1),
(2) Date: Mar. 29, 2016

(87) PCT Pub. No.: WO2015/046427
PCT Pub. Date: Apr. 2, 2015

(65) Prior Publication Data
US 2016/0238132 A1    Aug. 18, 2016

(30) Foreign Application Priority Data

Sep. 30, 2013    (JP) .............................. 2013-203425

(51) Int. Cl.
*F16J 9/26*    (2006.01)
*B24B 19/11*    (2006.01)
(Continued)

(52) U.S. Cl.
CPC ................. *F16J 9/26* (2013.01); *B23P 15/06* (2013.01); *B24B 19/11* (2013.01);
(Continued)

(58) Field of Classification Search
USPC .......... 277/442; 428/216, 332, 336, 469.472, 428/698; 427/331
See application file for complete search history.

(56) References Cited

U.S. PATENT DOCUMENTS

| 5,449,547 | A | 9/1995 | Miyazaki et al. |
| 6,395,379 | B1 * | 5/2002 | Braendle ............. C23C 14/0664 428/216 |

(Continued)

FOREIGN PATENT DOCUMENTS

| JP | 6-10454 | B2 | 2/1994 |
| JP | 6-265023 | A | 9/1994 |

(Continued)

OTHER PUBLICATIONS

Warcholinski et al "Hard CrCN/CrN multilayer coatings for tribological applications" Surface & Technology 204 (2010) p. 2289-2293.*

(Continued)

*Primary Examiner* — Archene Turner
(74) *Attorney, Agent, or Firm* — Birch, Stewart, Kolasch & Birch, LLP

(57) ABSTRACT

To provide a piston ring having a hard laminate coating having excellent scuffing resistance, wear resistance and peeling resistance, which can be used in an environment of high mechanical and thermal load in engines, the piston ring is provided on its outer peripheral sliding surface with a CrN-type hard coating as thick as 10-60 μm and comprising a CrN/CrCN laminate coating having hardness Hv of 1000 or more and residual compression stress of 1500 MPa or less, a laminate unit composed of a CrN layer and a CrCN layer being as thick as 30 nm or more; the CrN/CrCN (Continued)

laminate coating being formed by alternately laminating CrN layers and CrCN layers containing C dissolved in CrN by ion plating.

8 Claims, 3 Drawing Sheets

(51) Int. Cl.
　　C23C 14/00　　(2006.01)
　　C23C 14/06　　(2006.01)
　　B23P 15/06　　(2006.01)
　　C23C 14/32　　(2006.01)
　　C23C 28/00　　(2006.01)
(52) U.S. Cl.
　　CPC ...... *C23C 14/0021* (2013.01); *C23C 14/0641* (2013.01); *C23C 14/0664* (2013.01); *C23C 14/325* (2013.01); *C23C 28/347* (2013.01); *C23C 28/42* (2013.01)

(56) References Cited

U.S. PATENT DOCUMENTS

| | | | |
|---|---|---|---|
| 7,587,919 B1 * | 9/2009 | Young | B21D 37/20 76/107.1 |
| 8,597,797 B2 | 12/2013 | Sekiya et al. | |
| 2009/0075114 A1 * | 3/2009 | Hovsepian | C23C 14/022 428/469 |
| 2010/0119819 A1 * | 5/2010 | Rodgers | B64G 1/226 428/332 |
| 2010/0295251 A1 | 11/2010 | Sekiya et al. | |
| 2012/0160348 A1 * | 6/2012 | Bruce | C23C 14/0641 428/457 |
| 2013/0200572 A1 * | 8/2013 | Cha | F16J 9/26 277/442 |

FOREIGN PATENT DOCUMENTS

| | | |
|---|---|---|
| JP | 6-300130 A | 10/1994 |
| JP | 8-312779 A | 11/1996 |
| JP | 11-335813 A | 12/1999 |
| JP | 2005-60810 A | 3/2005 |
| JP | 2005-82822 A | 3/2005 |
| JP | 2005-187859 A | 7/2005 |
| JP | 2007-278314 A | 10/2007 |
| JP | 2007-290067 A | 11/2007 |
| JP | 2011-45970 A | 3/2011 |
| JP | 4839120 B2 | 12/2011 |
| WO | WO 2008/059791 A1 | 5/2008 |

OTHER PUBLICATIONS

Tong et al "Effects of carbon content on the microstrucure and mechanical property of cathodic arc evaporation deposited CrCN thin films" Surface & Techn 231 (2013) p. 482-486.*

Lugscheider et al "Cr—C—N coatings deposited with diifferent reactive carbon carrier gases in the arc PVD process" Surf. & Coat Techn 94-95 (1997) p. 416-421.*

International Search Report for PCT/JP2014/075630 dated Dec. 16, 2014.

Written Opinion of the International Searching Authority for PCT/JP2014/075630 (PCT/ISA/237) dated Dec. 16, 2014.

Extended European Search Report dated Apr. 26, 2017, in European Patent Application No. 14848323.3.

Warcholinski, B. and A. Gilewicz, "The Properties of Multilayer CrCN/CrN Coatings Dependent on Their Architecture," Plasma Processes and Polymers (2011), vol. 8, pp. 333-339.

* cited by examiner ered coating having different compositions. However, the metal layers are disadvantageous in scuffing resistance, despite better stress relaxation than in the composite nitride layer of JP 2005-187859 A.

PISTON RING

FIELD OF THE INVENTION

The present invention relates to a piston ring for automobile engines, particularly to a piston ring having hard laminate coating formed by ion plating for excellent scuffing resistance, wear resistance and peeling resistance.

BACKGROUND OF THE INVENTION

Piston rings have recently become used in increasingly severer environment, due to higher power of engines, higher combustion temperatures and larger load for meeting exhaust gas regulations, the use of low-viscosity lubricating oils, the diversification of fuels such as bioethanol, higher fuel injection pressure, etc. Even piston rings having hard chromium nitride (CrN) coatings formed by ion plating, which are now considered as having best scuffing resistance and wear resistance, may fail to exhibit sufficient performance due to the peeling of coatings by cracking and chipping. Accordingly, improvement in scuffing resistance, wear resistance and peeling resistance has been more strongly demanded than ever.

Because the chromium nitride formed by ion plating generally suffers chipping despite hardness, various improvements such as the controlling of crystal orientations, structures and porosity, the addition of a third element, the lamination of coatings, etc., have been made so far.

With respect to the addition of a third element to chromium nitride, to improve the toughness of CrN, JP 6-265023 A teaches the addition of oxygen (O), and JP 6-300130 A teaches the addition of carbon (C), both for solid solution. In addition, WO 2008/059791 discloses a chromium nitride coating having excellent wear resistance and cracking resistance, the coating having a columnar structure toward a coating surface; the concentration of carbon being 4-8% by weight per the total amount of main components of chromium, nitrogen and carbon; and the coating having Vickers hardness of 1600 or more, and fracture toughness of 3 MPa·m$^{1/2}$ or more.

With respect to the lamination of coating layers, for example, to solve the problem of the chipping-like peeling of a coating from an outer peripheral surface of a piston ring due to pitting fatigue, JP 8-312779 A discloses a coating formed by alternately laminating layers of columnar CrN crystals extending from the base material surface toward the coating surface and CrN crystal layers having flat fracture surface, or formed by alternately laminating layers having porosity of 0-0.5% by volume and layers having porosity of 1.5-20% by volume. From the same aspect, for example, JP 2005-187859 A discloses a hard, thick composite nitride coating of CrSiN and TiSiN; which comprises stress relaxation layers having a non-columnar crystal structure, which are sandwiched by hard layers of composite nitride columnar crystals with constant intervals and thickness to have reduced internal stress and high adhesion; the composite nitride coating being formed by alternately repeating high bias voltage for forming columnar crystals and low bias voltage for forming non-columnar crystals with predetermined intervals.

In both JP 8-312779 A and JP 2005-187859 A, layers of the same nitride with different structures (columnar structure layers and non-columnar structure layers, or porous layers and dense layers) are laminated. JP 2005-82822 A discloses a laminate coating comprising metal layers as the stress relaxation layers in JP 2005-187859 A, namely, a laminate coating having different compositions. However, the metal layers are disadvantageous in scuffing resistance, despite better stress relaxation than in the composite nitride layer of JP 2005-187859 A.

JP 2007-278314 A discloses a piston ring having a laminate coating obtained by alternately laminating compound layers comprising titanium, carbon and nitrogen, and compound layers comprising chromium, carbon and nitrogen. To provide the coating with excellent wear resistance without chipping when used as a top ring for diesel engines, the amount of carbon dissolved in the coating and the porosity of the coating are determined to have fracture toughness of about 3 MPa·m$^{1/2}$ or more and hardness Hv of 1700 or more, which have close relations to the performance of the coating.

However, even the laminated coatings described above are not sufficient for piston rings used in extremely severe environment. Cracking, chipping and peeling of the hard coatings due to fatigue are actually not completely overcome.

OBJECT OF THE INVENTION

An object of the present invention is to provide a piston ring having a hard laminate coating formed by ion plating for excellent scuffing resistance, wear resistance and peeling resistance, which can be used in an environment of high mechanical and thermal load in engines, and its production method.

SUMMARY OF THE INVENTION

As a result of intensive research with attention paid to the fracture toughness and hardness of a hard coating ion-plated on a piston ring, which is subjected to mechanical and thermal stress, as well as its residual stress introduced when formed, the inventors have found that by laminating CrCN layers containing C dissolved in CrN for high fracture toughness and hardness with CrN layers having relatively low hardness, and by controlling the thickness of each layer close to the size of each crystallite, it is possible to provide a piston ring with a hard laminate coating having improved hardness and fracture toughness, as well as optimized residual stress, thereby having excellent scuffing resistance, wear resistance and peeling resistance.

Thus, the piston ring of the present invention has a CrN-type hard coating as thick as 10-60 µm formed on its outer peripheral sliding surface;

the CrN-type hard coating comprising a CrN/CrCN laminate coating obtained by alternately laminating CrN layers and CrCN layers containing C dissolved in CrN;

a laminate unit composed of the CrN layer and the CrCN layer being as thick as 30 nm or more; and the CrN-type hard coating having hardness Hv of 1000 or more, and residual compression stress of 1500 MPa or less.

The CrCN layer preferably has a carbon concentration of 2-8% by mass. Accordingly, the CrN-type hard coating comprising CrN layers and CrCN layers laminated at about 1:1 preferably has a carbon concentration of 1-4% by mass.

In order that the CrN layers and the CrCN layers have high rigidity and strength, they preferably have as high crystallinity as possible. To this end, the laminate unit in the CrN-type hard coating is preferably as thick as 30-100 nm, in a range of 2-6 times the size of crystallite, when determined from the X-ray diffraction data of the CrN-type hard coating.

A surface of the CrN-type hard coating preferably has the maximum X-ray diffraction intensity in a CrN (200) plane.

An outermost surface of the outer peripheral sliding surface preferably has a composite structure comprising a CrN phase and a CrCN phase containing C dissolved in CrN.

The method of the present invention for producing a piston ring having a CrN-type hard coating as thick as 10-60 μm formed on its outer peripheral sliding surface, comprising the steps of adjusting the surface roughness Rzjis82 of the outer peripheral surface of a piston ring base material to 0.5-3 μm;

alternately forming CrN layers and CrCN layers containing C dissolved in CrN by arc ion plating to form a CrN/CrCN laminate coating; and then grinding the CrN/CrCN laminate coating.

The CrN layer is preferably formed using a nitrogen gas as a process gas, and the CrCN layer is preferably formed using a nitrogen gas, a hydrocarbon gas and an argon gas as a process gas. The flow rate of the process gas is preferably controlled. The process gas used in the formation of the CrN layer and the process gas used in the formation of the CrCN layer are preferably switched, while keeping arc discharge on a metal Cr cathode.

DESCRIPTION OF THE PREFERRED EMBODIMENTS

Figure 1:
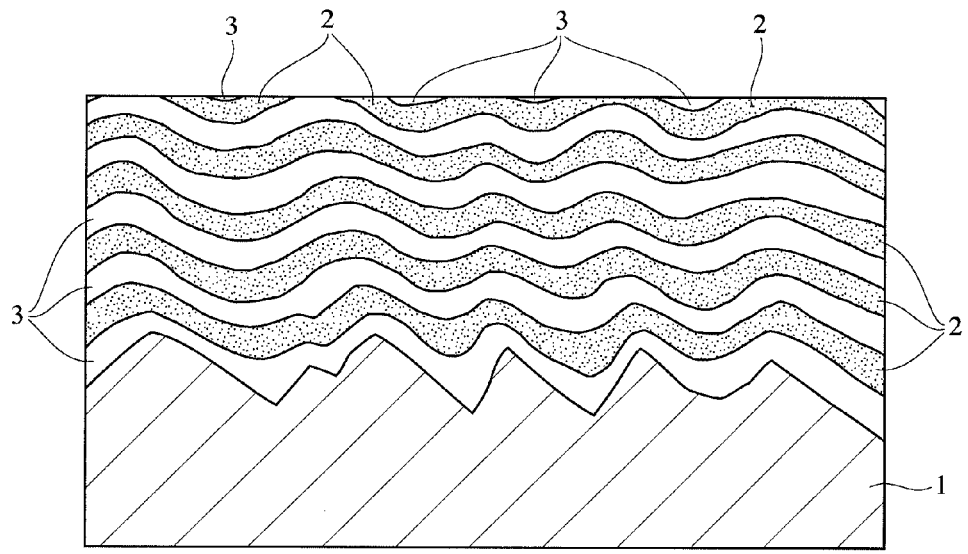
FIG. 1 is a view schematically showing a cross section of the piston ring of the present invention having a CrN/CrCN laminate coating.

The piston ring of the present invention has a CrN-type hard coating as thick as 10-60 μm on its outer peripheral sliding surface; the CrN-type hard coating comprising a CrN/CrCN laminate coating obtained by alternately laminating CrN layers and CrCN layers containing C dissolved in CrN; a laminate unit composed of the CrN layer and the CrCN layer having a thickness of 30 nm or more; and the CrN-type hard coating having hardness Hv of 1000 or more, and residual compression stress of 1500 MPa or less. To obtain a piston ring having excellent scuffing resistance, wear resistance and peeling resistance, the present invention is characterized by the laminate structure of the CrN/CrCN laminate coating, and its formation method.

The term "CrN-type chromium nitride" means that most of chromium nitride has a CrN type, though $Cr_2N$-type chromium nitride may be contained. CrCN also has a CrN-type crystal structure, with C dissolved in CrN to partially substitute lattice positions of N. It is thus difficult to distinguish a CrN peak from a CrCN peak on an X-ray diffraction chart. Accordingly, the crystallite size of CrN/CrCN described below is determined from two overlapped peaks.

The thickness of a laminate unit composed of a CrN layer and a CrCN layer, namely, a sum of the thickness of a CrN layer and the thickness of a CrCN layer, is 30 nm or more. When the thickness of the laminate unit is less than 30 nm, the productivity of forming a hard coating as thick as 10-60 μm on a piston ring according to the present invention is undesirably low, because a growing speed of the coating must be low. On the other hand, when the thickness of the laminate unit exceeds 100 nm, defects such as grain boundaries and pores are likely introduced due to an increased growing speed of the coating. The thickness of the laminate unit is preferably 100 nm or less, more preferably 80 nm or less.

The coating has hardness Hv of 1000 or more. When the hardness Hv of the coating is less than 1000, cracks perpendicular to the coating surface are undesirably generated. On the high hardness side, it is preferably Hv 1450 or less.

The residual compression stress of the coating is 1500 MPa or less. When the residual compression stress exceeds 1500 MPa, the peeling of the coating occurs, not suitable for the piston ring. Oppositely, lower residual compression stress provides the coating with lower hardness. Accordingly, the coating preferably has residual compression stress of 300 MPa or more.

In the CrCN layer, C is dissolved in CrN to partially take lattice positions in place of N, thereby changing the ion radii of both Cr and N (or C), and increasing lattice strain to increase hardness. It is also said that C reduces internal energy stored during crystal growth while keeping high hardness, resulting in macroscopically low residual stress and high fracture toughness. To obtain these characteristics, the concentration of carbon in the CrCN layer is preferably 2-8% by mass. When the CrN layer and the CrCN layer have a thickness ratio of 1:1, the concentration of carbon in the CrN/CrCN laminate coating is preferably 1-4% by mass.

When cracking or chipping occurs in the hard coating formed by arc ion plating on the piston ring, cracks propagate from defects pre-exited on or inside the coating, due to tensile stress generated by sliding on the outermost surface or shear stress inside the coating generated by sliding, resulting in fracture of the coating, such as chipping, detachment or peeling. With well-balanced residual compression stress in the CrN/CrCN laminate coating, tensile stress and shear stress due to friction are reduced, suppressing the propagation of cracks. Also, the propagation of cracks perpendicular to the coating surface is stopped by the CrCN layers having high rigidity (Young's modulus and hardness).

Because a laminate coating composed of different phases generally has strain remaining in their boundaries, cracks are likely to propagate along the boundaries. However, because CrN and CrCN have basically the same crystal structure, with extremely close lattice constants, the CrN/CrCN laminate coating has well aligned, strong boundaries. When the thickness of each of the CrN layer and the CrCN layer is close to the size of crystallite therein, the CrN/CrCN laminate coating may be regarded as having a single crystal structure in a thickness direction, having much higher rigidity than a polycrystalline structure. Because peaks of the CrN phase and the CrCN phase are not distinguished in X-ray diffraction as described above, however, both phases are regarded as having the same crystallite size. It is considered that each of the CrN layer and the CrCN layer has a polycrystalline structure having small angle tilt boundaries in parallel to the coating surface, which suppresses the propagation of cracks in both interfaces and layers in the laminate coating. The thickness of the laminate unit composed of a CrN layer and a CrCN layer is preferably in a range of 2-6 times, more preferably in a range of 2-4 times, of the size of the CrN/CrCN crystallite.

Though not particularly restrictive, a thickness ratio of the CrN layer to the CrCN layer is preferably in a range of 3:7 to 7:3, taking into consideration the function of the CrN layer as a stress relaxation layer.

The growth orientations of the CrN layer and the CrCN layer vary depending on film-forming conditions. Though not particularly restrictive, the CrN/CrCN laminate preferably has the maximum diffraction intensity in a CrN (200) plane.

The piston ring of the present invention preferably has a composite structure comprising CrN and CrCN on the outermost surface of the outer peripheral sliding surface. Even though the CrN/CrCN laminate coating is formed in parallel on a completely flat surface, the outermost surface would have a composite structure of CrN and CrCN, if the outer peripheral sliding surface were ground with an angle to the base material (substrate). Because a barrel-faced sliding surface preferable for a compression ring is not in parallel with the base material surface, a composite structure of CrN and CrCN can be basically obtained. Also, when a laminate coating of CrN 3 and CrCN 2 is formed on a rough surface of the base material 1 as shown in FIG. 1, a wave-like laminate coating is formed, so that its flat-ground outermost peripheral sliding surface would have a composite structure of CrN 3 and CrCN 2. In general, a laminate coating of CrN 3 and CrCN 2 is more preferably formed on a roughened surface of the base material. A composite structure of CrN 3 and CrCN 2 appearing on the outermost surface preferably has a contour-like pattern, depending on the thickness of the laminate, the angle of a ground surface to the laminate surface, the wavelength of the wave-like laminate. The widths of phases having a contour-like pattern are preferably 1 μm or less, more preferably 0.4 μm or less, on average.

A metal layer for improving adhesion may be formed between the laminate coating and the base material.

The method of the present invention for producing a piston ring having a CrN-type hard coating as thick as 10-60 μm on its outer peripheral sliding surface comprises the steps of adjusting the surface roughness Rzjis82 of an outer peripheral surface of a piston ring base material to 0.5-3 μm;

alternately forming CrN layers and CrCN layers containing C dissolved in CrN by arc ion plating to form a CrN/CrCN laminate coating; and then grinding the CrN/CrCN laminate coating.

The outer peripheral surface of the piston ring base material is adjusted to have surface roughness Rzjis82 of 0.5-3 μm by shot blasting, etc., to secure the adhesion of the laminate coating to the base material, and to have a composite structure of CrN and CrCN on the outermost surface of the outer peripheral sliding surface. After the CrN/CrCN laminate coating is formed by arc ion plating, lapping or grinding with a grinder is conducted, and plunge grinding is preferable to form the outer peripheral shape.

Figure 2:
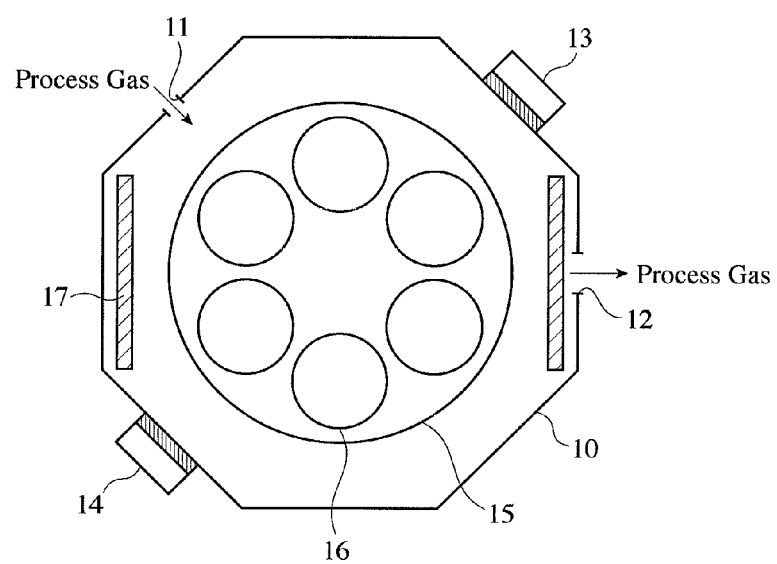
FIG. 2 is a schematic view showing an arc ion plating apparatus used in the present invention.

In the present invention, the CrN/CrCN laminate coating is formed using an arc ion plating apparatus shown in the schematic plan view of FIG. 2. In this apparatus, works 16 (stacked piston rings) are set in a vacuum chamber 10 having a process gas inlet 11 and a process gas outlet 12, with metal Cr cathodes (targets) 13, 14 of evaporation sources opposing via a rotating table 15. The works 16 per se are rotated on the rotating table 15. Each evaporation source 13, 14 is connected to an anode (not shown) of an arc power source, and the rotating table 15 is connected to a bias power source (not shown). Heaters 17 are attached to an apparatus wall. An arc ion plating method for forming the CrN layer comprises introducing a process gas [nitrogen ($N_2$)] into the vacuum chamber 10; generating arc on the metal Cr cathode of each evaporation source to melt the metal Cr instantaneously, so that it is ionized in nitrogen plasma; and causing the reaction of chromium ions with nitrogen plasma to form CrN, which is attracted to a surface of each work 16 to which negative bias voltage is applied, thereby forming a CrN layer. When the CrCN layer is formed, a nitrogen ($N_2$) gas and a hydrocarbon (for example, $CH_4$) gas are preferably used as a process gas, with an argon (Ar) gas added. In arc ion plating, a high ionization ratio of metal Cr can be achieved by a high energy density. Because metal Cr has particularly high vapor pressure at the melting point, a high film-forming speed is achieved, enabling the industrial production of a coating as thick as 10-60 μm required for the piston ring.

The CrN/CrCN laminate coating can be formed by evaporating and ionizing Cr by discharge on each metal Cr cathode, and switching the process gas. Though the process gas may be controlled by pressure, it is preferably controlled by a flow rate for rapid stabilization. The process gas is preferably switched, while keeping arc discharge on each metal Cr cathode. To form a laminate coating having clearly distinguishable CrN layers and CrCN layers, the arc discharge is preferably stopped, and generated again after the flow rate of a process gas is stabilized. However, the arc discharge is kept when switching the process gases, to avoid the problem that a coating deposited on a striker rod is scattered to increase a kind of pits when arc discharge is generated again. Because the composition of chromium nitride is determined by the amount of Cr evaporated from the metal Cr cathode and the partial pressure of a nitrogen gas, the arc current of the evaporation source and the partial pressure of a nitrogen gas are adjusted to form a coating based on CrN-type chromium nitride in the present invention. The carbon concentration in the CrCN layer is of course adjusted by the partial pressure of a hydrocarbon gas. The thickness of each of the CrN layer and the CrCN layer is basically controlled by the forming time of each layer. The thickness of the CrN layer and the CrCN layer can be measured by direct observation by a field emission-scanning electron microscope (FE-SEM), etc., and the thickness of each laminate unit, which is a sum of the thickness of a CrN layer and the thickness of a CrCN layer, is obtained by dividing the thickness by the repeating number of the laminate units, or multiplying a coating-forming speed (μm/min) by the coating-forming time of a CrN layer and a CrCN layer. Because higher arc current provides a higher coating-forming speed, the thickness of the laminate unit becomes smaller as the arc current is lowered, or as the time of forming each layer is shortened.

It is generally the that the crystal structure of the coating formed by arc ion plating is adjustable by pressure in the furnace and bias voltage; higher pressure in the furnace and lower bias voltage provide a columnar crystal structure, and oppositely lower pressure in the furnace and higher bias voltage provide a granular crystal structure. However, it is actually not necessarily true, as JP 2005-187859 A teaches that columnar crystals are obtained by higher bias voltage. A film-forming environment in ion plating is extremely complicated; for example, if an apparatus were changed, the same crystal structure would not necessarily be obtained by the same arc current, pressure in the furnace and bias voltage. Of course, not only the base material, the crystal structure, the temperature and the surface condition, but also the furnace structure (arrangement of a work relative to the evaporation source, etc.) exert relatively large influence. Accordingly, coating-forming conditions should be determined for every apparatus.

Example 1

A wire of SWOSC-V was formed into a piston ring having a rectangular cross section [nominal diameter (d): 96 mm, thickness (a1): 3.8 mm, and width (h1): 2.5 mm], and a barrel-faced outer peripheral surface. 50 piston rings were stacked, with outer peripheral surfaces shot-blasted to adjust their surface roughness Rzjis82 to 1.9 µm, and set in an arc ion plating apparatus (AIP-S40 available from Kobe Steel, Ltd.). As an evaporation source target, metal chromium having purity of 99.9% was used. After evacuating the apparatus to $1.0 \times 10^{-2}$ Pa, an Ar gas was introduced into the apparatus to 1.0 Pa. An outer peripheral surface of each piston ring base material was cleaned by a bombardment treatment with bias voltage of −900 V, using an Ar gas having purity of 99.99%.

A metal Cr layer for improved adhesion was formed by an ion plating treatment for 10 minutes, with arc current of 150 A at the metal chromium cathode, bias voltage of 0 V, and a table rotation speed of 3 rpm. Thereafter, with an $N_2$ gas having purity of 99.999% introduced into the apparatus to 4.5 Pa, a CrN layer was formed at bias voltage of −18 V for 24 seconds, and the flow rates of an $N_2$ gas, the above Ar gas and a $CH_4$ gas having purity of 99.9% was adjusted such that the $N_2$ gas was at 0.87 Pa, the Ar gas was at 0.09 Pa, and was $CH_4$ gas was at 0.54 Pa, to form a CrCN layer at bias voltage of −16 V for 30 seconds. The formation of the CrN layer and the CrCN layer was repeated 400 times, to form a CrN/CrCN laminate coating. The piston ring having a CrN/CrCN laminate coating was subjected to measurements below.

[1] Measurement of Thickness

Figure 3:
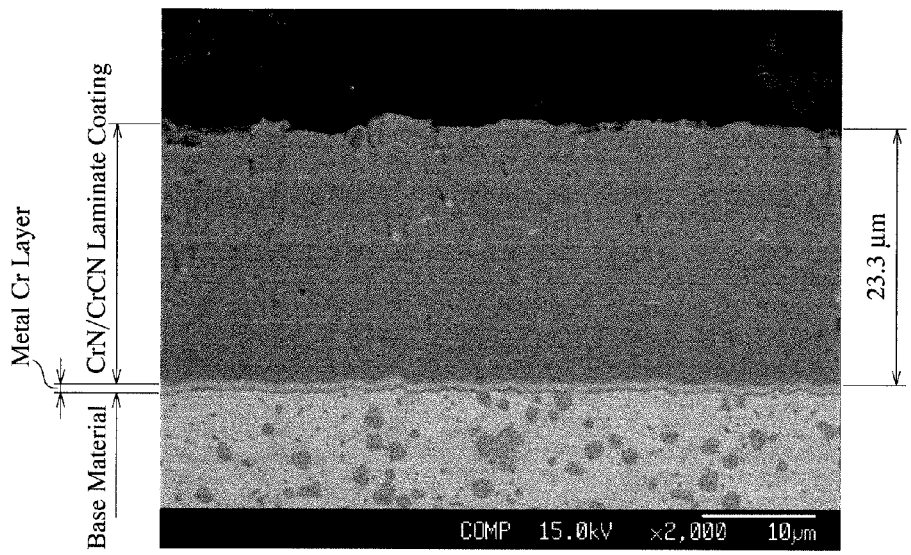
FIG. 3 is a scanning electron photomicrograph showing a cross section of the piston ring of Example 1 having a CrN/CrCN laminate coating.

On a scanning electron photomicrograph (SEM photograph) of a mirror-polished cross-sectional surface of a piston ring perpendicular to its coating surface, the distance between the coating surface and the base material surface was measured as the thickness of a sample. The SEM photograph is shown in FIG. 3. The thickness of the laminate coating excluding the intermediate layer of metal Cr in Example 1 was 23.3 µm. The coating (dark gray) contained a few metal Cr particles (bright white). The thickness of each laminate unit (one CrN layer+one CrCN layer) was 0.0583 µm (58.3 nm), calculated from the above thickness of 23.3 µm and the number (400) of repeating laminate units.

[2] Measurement of Carbon Concentration

The concentration of carbon in the coating was determined by the quantitative analysis of a coating cross section by EPMA (JEOL, JXA-8600S). The concentration of carbon was 2.7% by mass in Example 1.

[3] Measurement of Hardness

The hardness of the mirror-polished coating surface was measured by a micro-Vickers hardness tester, with a test force of 0.9807 N. The CrN/CrCN laminate coating of Example 1 had hardness Hv of 1266.

[4] Measurement of Residual Stress

The residual stress σ of the coating was calculated by the following Stoney's formula:

$$\sigma = -[E_s(1-\nu_s)h_s^2]/6h_f\Delta R \quad (1),$$

wherein $E_s$ is a Young's modulus (N/mm$^2$) of a base material, $\nu_s$ is a Poisson's ratio of a base material, $h_s$ is the thickness of a base material, $h_f$ is the thickness of a coating, and $\Delta R$ is a curvature variation. Here, $E_s$ and $\nu_s$ were 200,000 N/mm$^2$ and 0.3, respectively. The residual stress in Example 1 was −1,122 MPa (1,122 MPa as compression).

[5] Measurement of X-Ray Diffraction

Figure 4:
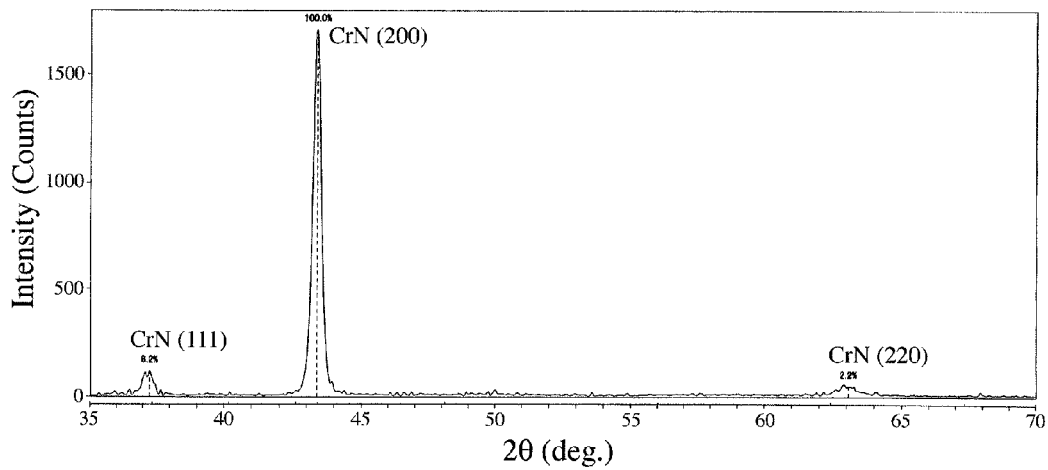
FIG. 4 is a view showing an X-ray diffraction pattern in Example 1.

The X-ray diffraction intensity of the mirror-polished coating surface was measured with Cu-Kα rays at tube voltage of 40 kV, and tube current of 30 mA in a range of 2θ=35-70°. The X-ray diffraction pattern of Example 1, which is shown in FIG. 4, had the maximum peak intensity in a CrN (200) plane, and the second maximum peak intensities in a CrN (111) plane and a CrN (220) plane. Thus, the CrN phase and the CrCN phase could not be distinguished. With respect to the CrN (200) plane, the crystallite size $D_{hkl}$ was calculated by the following Scherrer's formula:

$$D_{hkl} = K\lambda/\beta \cos\theta \quad (2),$$

wherein K is a Scherrer's constant (=0.94), λ is the wavelength of X-rays (Cu: 1.5406 Å), β is a full width at half maximum (FWHM), and θ is a Bragg's angle. The CrN-type hard coating of Example 1 had crystallite as large as 22.8 nm. The thickness of each laminate unit calculated from the thickness was 58.3 nm, 2.6 times the size of chromium nitride crystallite.

[6] Rolling Contact Fatigue Test

Figure 5:
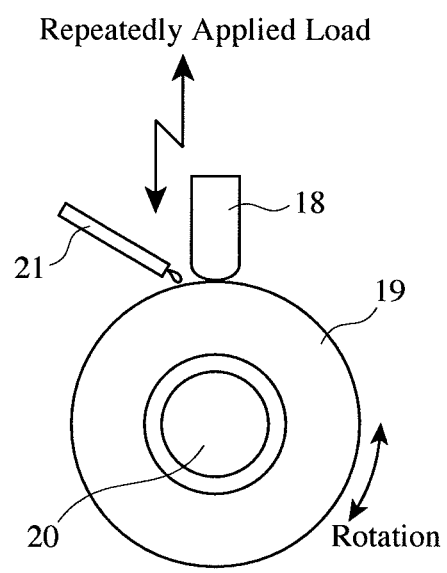
FIG. 5 is a schematic view showing a rolling contact fatigue test machine.

A rolling contact fatigue test was conducted to evaluate the peeling of a coating in an actual engine test. FIG. 5 schematically shows a rolling contact fatigue test machine. In the rolling contact fatigue test, a load was repeatedly applied to a test piece 18 sliding on a rotating drum 19 to cause the peeling of the coating in a relatively short period of time. The detachment of the coating depends on a friction coefficient, a load (maximum Hertzian stress), and the repetition number of load application under the same lubrication conditions. The test conditions were as follows:

- Test piece: Cut piston ring piece having a CrC/CrCN laminate coating,
- Load: 98-196 N with a sine curve of 50 Hz,
- Mating member: Drum of SUJ2 having a diameter of 80 mm,
- Sliding speed: Reciprocal sliding at a speed of ±2 m/second with acceleration of 0.08 m/second$^2$ for 10 seconds,
- Lubricant: 4 cc/min of pure water,
- Temperature: 80° C. on a drum surface, and
- Test time: 1 hour.

The test results were evaluated by the detachment of the coating. The rolling contact fatigue test results indicate that there was no detachment in the coating of Example 1.

Examples 2-8 and Comparative Examples 1-3

An ion plating treatment was conducted under the coating-forming conditions shown in Table 1 in each of Examples 2-8 and Comparative Examples 1-3. Table 1 also shows the coating-forming conditions in Example 1. Example 2 was lower than Example 1 in bias voltage in the formation of CrCN, and Example 3 was lower than Example 1 in gas partial pressure in the formation of CrN. Arc current supplied to the evaporation source was as high as 180 A in Example 4. Gas partial pressure in the formation of CrN in Example 5 was just a middle of those in Examples 1 and 3, with a slightly longer coating-forming time of each CrN layer and each CrCN layer. The coating-forming time of each CrN layer and each CrCN layer in Example 6 was about 1.6 times as long as in Example 1. Examples 7 and 8 were conducted at higher arc current supplied to the evaporation source than in Example 1, with a longer forming time of each CrN layer and each CrCN layer, to change the thickness of a laminate unit. During the formation of the coating, Comparative Example 1 had higher gas partial pressure, and Comparative Example 2 had larger bias voltage, than in Example 1. In Comparative Example 3, a single layer of CrCN instead of a laminate was coated.

TABLE 1

| No. | Current[1] (A) | Gas Partial Pressure (Pa) CrN | Gas Partial Pressure (Pa) CrCN | Bias Voltage (V) CrN | Bias Voltage (V) CrCN | Time for Forming One Layer (min) CrCN | Time for Forming One Layer (min) CrN | Number of Laminate Units |
|---|---|---|---|---|---|---|---|---|
| Example 1 | 150 | 4.5 | 1.5 | −18 | −16 | 0.4 | 0.5 | 400 |
| Example 2 | 150 | 4.5 | 1.5 | −18 | −12 | 0.4 | 0.5 | 400 |
| Example 3 | 150 | 1.5 | 1.5 | −18 | −16 | 0.4 | 0.5 | 400 |
| Example 4 | 180 | 4.5 | 1.5 | −18 | −16 | 0.4 | 0.5 | 400 |
| Example 5 | 150 | 3.0 | 1.5 | −18 | −16 | 0.6 | 0.7 | 400 |
| Example 6 | 150 | 4.5 | 1.5 | −18 | −16 | 0.7 | 0.8 | 400 |
| Example 7 | 180 | 4.5 | 1.5 | −18 | −16 | 1.5 | 1.8 | 150 |
| Example 8 | 180 | 3.0 | 1.5 | −18 | −16 | 2.8 | 3.5 | 60 |
| Com. Ex. 1 | 150 | 6.0 | 3.0 | −18 | −16 | 0.4 | 0.5 | 400 |
| Com. Ex. 2 | 150 | 4.5 | 1.5 | −100 | −100 | 0.8 | 1 | 200 |
| Com. Ex. 3[2] | 150 | — | 1.5 | — | −16 | — | — | — |

Note:
[1] Arc current supplied to the evaporation source.
[2] The coating was formed for 6 hours.

The EPMA measurement results of the carbon concentration in the coating, and the X-ray diffraction measurement results are shown in Table 2. The carbon concentrations in the coatings were 2.4-2.8% by mass, except in Comparative Example 3. Incidentally, the coating of Comparative Example 3 composed of CrCN alone had a carbon concentration of 5.8% by mass. In all Examples and Comparative Examples, the coatings were composed of CrN-type chromium nitride, with the maximum peak in a CrN (200) plane. The CrCN layers and the CrN layers could not be distinguished on the X-ray diffraction charts. The crystallite sizes were in a range of 18.5-33.1 nm. Thickness ratios of the CrN layer to the CrCN layer in the CrN/CrCN laminates were about 1/1.

TABLE 2

| No. | Carbon Concentration[1] (% by mass) | Coating Structure Crystal Phase | Coating Structure Maximum Peak Plane | Crystallite Size (nm) |
|---|---|---|---|---|
| Example 1 | 2.7 | CrN[2] | CrN (200) | 22.8 |
| Example 2 | 2.8 | CrN | CrN (200) | 27.5 |
| Example 3 | 2.7 | CrN | CrN (200) | 18.5 |
| Example 4 | 2.7 | CrN | CrN (200) | 26.5 |
| Example 5 | 2.5 | CrN | CrN (200) | 33.1 |
| Example 6 | 2.4 | CrN | CrN (200) | 26.3 |
| Example 7 | 2.7 | CrN | CrN (200) | 25.5 |
| Example 8 | 2.7 | CrN | CrN (200) | 24.2 |
| Com. Ex. 1 | 2.5 | CrN | CrN (200) | 22.5 |
| Com. Ex. 2 | 2.8 | CrN | CrN (200) | 31.1 |
| Com. Ex. 3 | 5.8 | CrN | CrN (200) | 29.3 |

Note:
[1] The concentration of carbon in the coating.
[2] The CrCN layer was not distinguishable from the CrN layer on an X-ray diffraction chart.

The measurement results of the thickness, the coating hardness and the residual compression stress, as well as the rolling contact fatigue test results are shown in Table 3. In Examples 1-8, and Comparative Examples 1 and 2, the thicknesses were 18.9-39.5 μm. The thickness of each laminate unit was 47.3-463 nm, when calculated from the above thickness value and the repeating number of the laminate unit. The ratio of the thickness of each laminate unit to the crystallite size of each CrN-type hard coating (shown in Table 2) determined by the measured X-ray diffraction was 2.0-19.1. Examples 1-8 had coating hardness Hv of 1240-1482, and residual stress of −1025 to −1383 MPa (a negative symbol expresses "compression"). The coating of Comparative Example 1 had hardness of 957 and residual stress of −623 MPa. The coating of Comparative Example 2 had hardness of 1611 and residual stress of −1530 MPa. The coating of Comparative Example 3 had hardness of 1900 and residual stress of −1740 MPa. The rolling contact fatigue test results indicate that the coating was slightly detached in Example 7, that the coating was micro-cracked in Example 8, and that the coating was neither detached nor cracked in Examples 1-6. On the other hand, the detachment of the coating was observed in Comparative Examples 1-3.

TABLE 3

| No. | Thickness (μm) | Laminate Unit Thickness T (nm) | T/S[1] | Coating Hardness (Hv) | Residual Stress (MPa) | Rolling Contact Fatigue Test Results[2] |
|---|---|---|---|---|---|---|
| Example 1 | 23.3 | 58.3 | 2.6 | 1266 | −1122 | No |
| Example 2 | 22.4 | 56 | 2.0 | 1293 | −1029 | No |
| Example 3 | 18.9 | 47.3 | 2.6 | 1425 | −1357 | No |
| Example 4 | 29.3 | 73.3 | 2.8 | 1259 | −1150 | No |
| Example 5 | 31.3 | 78.3 | 2.4 | 1310 | −1209 | No |
| Example 6 | 39.5 | 98.8 | 3.8 | 1335 | −1280 | No |
| Example 7 | 32.4 | 216 | 8.5 | 1240 | −1025 | Slightly Detached[3] |
| Example 8 | 27.8 | 463 | 19.1 | 1482 | −1383 | Micro-cracked |

TABLE 3-continued

| No. | Thickness (μm) | Laminate Unit Thickness T (nm) | T/S[1] | Coating Hardness (Hv) | Residual Stress (MPa) | Rolling Contact Fatigue Test Results[2] |
|---|---|---|---|---|---|---|
| Com. Ex. 1 | 25.8 | 64.5 | 2.9 | 957 | −623 | Detached[4] |
| Com. Ex. 2 | 21.4 | 107 | 3.4 | 1611 | −1530 | Detached |
| Com. Ex. 3 | 18.4 | — | — | 1900 | −1740 | Detached |

Note:
[1]T/S means a ratio of laminate unit thickness/crystallite size of CrN-type laminate coating.
[2]The detachment of the coating and the cracking on the coating surface were measured by the rolling contact fatigue test.
[3]The coating was slightly detached.
[4]The coating was detached.

EFFECTS OF THE INVENTION

Because in the piston ring of the present invention having a hard CrN/CrCN laminate coating for excellent scuffing resistance, wear resistance and peeling resistance, CrN layers having relatively low hardness and CrCN layers having high fracture toughness and hardness are alternately laminated, the CrN layers function as stress relaxation layers, suppressing the generation and/or propagation of cracks, thereby exhibiting high peeling resistance. From the aspect of the propagation of cracks, by laminating CrCN layers having high Young's modulus and hardness, and by making the thickness of a laminate unit composed of a CrN layer and a CrCN layer close to a sum of the crystallite sizes of these crystals, CrN layers and CrCN layers have high crystallinity (high rigidity), thereby providing a coating with high resistance to the propagation of cracks. Accordingly, the piston ring having a hard coating formed by laminating CrN layers and CrCN layers has well-balanced residual compression stress for exhibiting excellent scuffing resistance, wear resistance and peeling resistance, so that it can be used in diversified severe environment.

What is claimed is:

1. A piston ring having a CrN-type hard coating as thick as 10-60 μm formed on its outer peripheral sliding surface;
said CrN-type hard coating comprising a CrN/CrCN laminate coating obtained by alternately laminating CrN layers and CrCN layers containing C dissolved in CrN;
a laminate unit composed of said CrN layer and said CrCN layer being as thick as 30-100 nm; and
said CrN-type hard coating having hardness Hv of 1000-1450, and residual compression stress of 1500 MPa or less;
wherein an outermost surface of said outer peripheral sliding surface has a composite structure comprising a CrN phase and a CrCN phase containing C dissolved in CrN.

2. The piston ring according to claim 1, wherein said CrN-type hard coating has a carbon concentration of 1-4% by mass.

3. The piston ring according to claim 1, wherein said laminate unit in said CrN/CrCN laminate coating has a thickness in a range of 2-6 times the size of CrN crystallite, when determined from the X-ray diffraction data of said CrN-type hard coating.

4. The piston ring according to claim 1, wherein a surface of said CrN-type hard coating has the maximum X-ray diffraction intensity in a CrN (200) plane.

5. A method for producing a piston ring having a CrN-type hard coating as thick as 10-60 μm formed on its outer peripheral sliding surface, comprising the steps of
adjusting the surface roughness Rzjis82 of the outer peripheral surface of a piston ring base material to 0.5-3 μm;
alternately forming CrN layers and CrCN layers containing C dissolved in CrN by arc ion plating to form a CrN/CrCN laminate coating having a laminate unit composed of said CrN layer and said CrCN layer being as thick as 30-100 nm; and then
grinding said CrN/CrCN laminate coating to form an outermost surface of said outer peripheral sliding surface having a composite structure comprising a CrN phase and a CrCN phase containing C dissolved in CrN.

6. The method for producing a piston ring according to claim 5, wherein said CrN layer is formed using a nitrogen gas as a process gas; and wherein said CrCN layer is formed using a nitrogen gas, a hydrocarbon gas and an argon gas as a process gas.

7. The method for producing a piston ring according to claim 6, wherein the flow rate of said process gas is controlled.

8. The method for producing a piston ring according to claim 5, wherein the process gas used in the formation of said CrN layer and the process gas used in the formation of said CrCN layer are switched, while keeping arc discharge on a metal Cr cathode.

* * * * *